(12) United States Patent
Kumar

(10) Patent No.: US 12,107,578 B1
(45) Date of Patent: Oct. 1, 2024

(54) THIN-OXIDE VOLTAGE LEVEL SHIFTER

(71) Applicant: Cadence Design Systems, Inc., San Jose, CA (US)

(72) Inventor: Vinod Kumar, Pratapgarh (IN)

(73) Assignee: Cadence Design Systems, Inc., San Jose, CA (US)

( * ) Notice: Subject to any disclaimer, the term of this patent is extended or adjusted under 35 U.S.C. 154(b) by 31 days.

(21) Appl. No.: 18/075,117

(22) Filed: Dec. 5, 2022

(51) Int. Cl.
*H03L 5/00* (2006.01)
*H03K 19/003* (2006.01)
*H03K 19/0175* (2006.01)
*H03K 19/0185* (2006.01)

(52) U.S. Cl.
CPC .............................. *H03K 19/018521* (2013.01)

(58) Field of Classification Search
None
See application file for complete search history.

(56) References Cited

U.S. PATENT DOCUMENTS 10,804,884 B1 * 10/2020 Tsai ............... H03K 19/018528
2015/0280714 A1 * 10/2015 Kumar ............... H03K 3/35613
327/333

\* cited by examiner

*Primary Examiner* — Kenneth B Wells
(74) *Attorney, Agent, or Firm* — Schwegman Lundberg & Woessner, P.A.

(57) ABSTRACT

Methods and systems are provided for performing voltage level shifting using thin-oxide devices. The methods and systems convert an input signal associated with a first voltage domain to output signals associated with the first and second voltage domains. A first set of thin-oxide devices generate a first output signal at the high-level voltage signal when the input signal comprises a high logic level and generate the first output signal at a ground level voltage signal when the input signal comprises a low logic level. A second set of thin-oxide devices generate a second output signal at a power supply voltage level of the second voltage domain when the input signal comprises the high logic level and generate the second output signal at the second bias voltage when the input signal comprises the low logic level.

19 Claims, 8 Drawing Sheets

THIN-OXIDE VOLTAGE LEVEL SHIFTER

TECHNICAL FIELD

The present disclosure generally relates to the technical field of circuit design and integrated circuits (ICs). In particular, the present disclosure addresses systems and methods for level shifting signals exchanged between low-voltage domain and high-voltage domain by using thin-oxide devices.

BACKGROUND

An IC layout specifies portions of various components of an IC. An IC typically includes a large number of registers, latches, flip-flops, multipliers, and/or other types of clocked devices, which are referred to herein generally as "clock sinks" or "sinks." Certain ICs can be implemented using thin-oxide devices while other ICs are implemented using thick-oxide devices. The thin-oxide devices typically operate at a much lower threshold voltage (turn-on voltage) than the thick-oxide devices. Thus, managing the voltage levels of the signals these devices exchange is an important aspect of circuit design.

BRIEF DESCRIPTION OF THE DRAWINGS

To easily identify the discussion of any particular element or act, the most significant digit or digits in a reference number refer to the figure number in which that element is first introduced.

Various ones of the appended drawings merely illustrate example embodiments of the present inventive subject matter and cannot be considered as limiting its scope.

DETAILED DESCRIPTION

Figure 1:
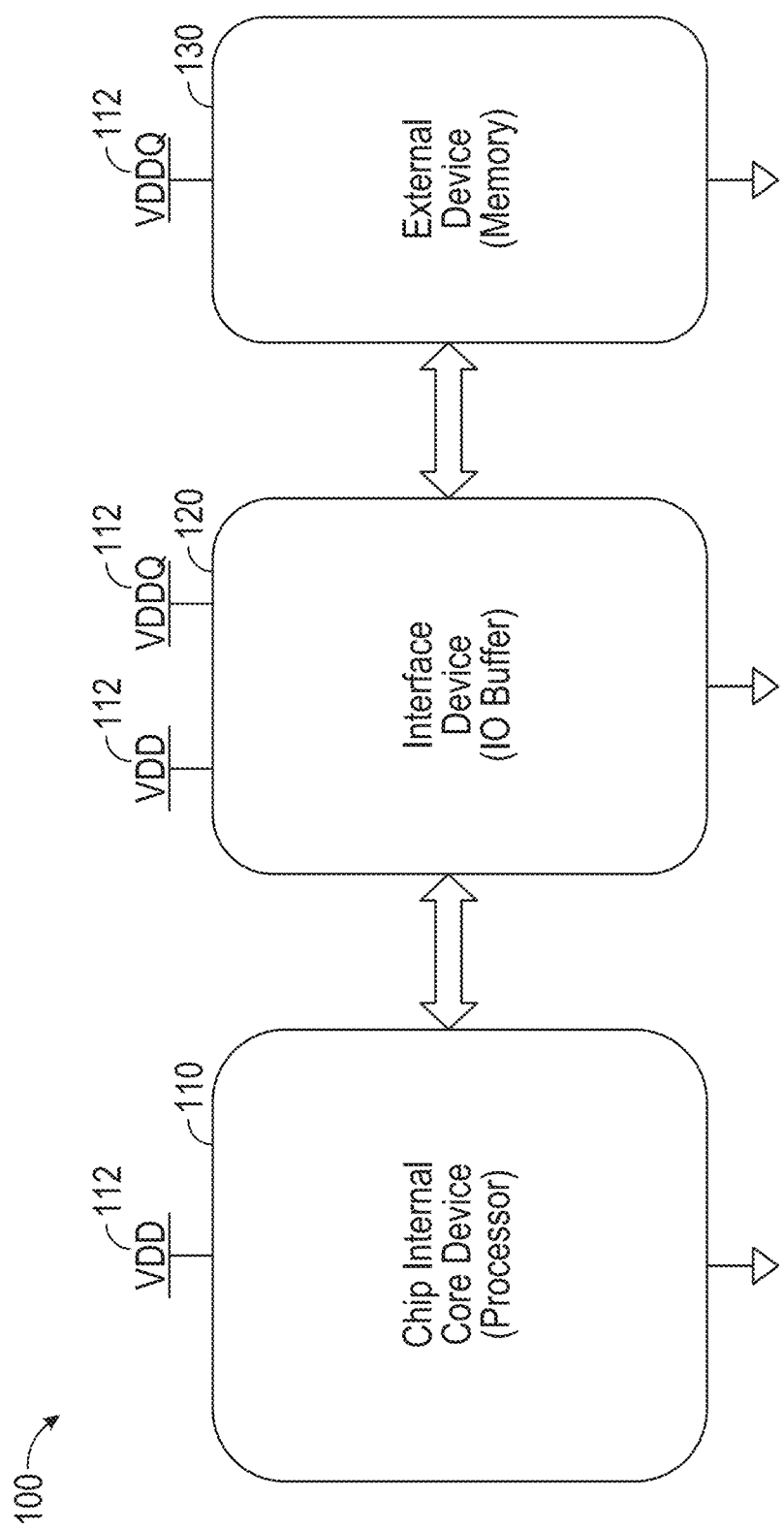
FIG. 1 illustrates an example circuit design having a mix of thin-oxide and thick-oxide devices, in accordance with some embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Electronic design automation (EDA) software systems commonly perform level shifting operations to handle communication of signals between different physical components. Specifically, one or more core devices which can be implemented using thin-oxide devices (transistors) can be used to implement various processors. Other devices, such as thick-oxide devices (transistors) can be used to implement memory that is coupled to the various processors. Typical systems employ a level shifter that is implemented using a mix of thin-oxide and thick-oxide devices to manage and shift the voltage levels of the signals exchanged between the thin-oxide and thick-oxide devices. Implementing both thin-oxide and thick-oxide devices on a single physical component can be very challenging. Particularly, thin-oxide devices use one process and fabrication technology that differs from the process and fabrication technology used to implement thick-oxide devices. Thus, applying both processes and fabrication technologies to the same physical device, component or chip can introduce complexities and increase costs and time to manufacture the devices.

In addition, as the technology is shrinking, the operating voltage range of devices is reduced. However, the operating voltage of external interface devices remains the same. Many of the advance technology nodes fail to support thick-oxide devices and have only the thin-oxide devices also known as core devices which can tolerate only lower voltage stress. Typically, input/output (IO) buffers connect the core of the chip operating at lower voltage with the external peripheral devices operating at the higher voltage. In the advance technology nodes where only thin-oxide devices are available it becomes challenging to design a high-speed IO buffer by using only the thin-oxide devices. Usually, a level shifter is used to transfer the signal's voltage domain from the core supply voltage (VDD) domain (e.g., 0.75V) to the IO supply voltage (VDDQ) domain (e.g., 1.35V). Such level shifters are able to handle ramp-up and ramp-down of power supplies in different sequences constraint-free which provides the flexibility to power ON and OFF the VDD and VDDQ supply independently. Specifically, since both the core supply VDD and IO supply VDDQ are independent supply sources, either of them can be ON or OFF at any given time to reduce the effective power consumption of the chip. During power ramp-up and ramp-down, the slope of VDD supply and VDDQ supply can be different, which can introduce transients at various outputs of the level shifter, which can cause unexpected operations. Therefore, ensuring the reliability of devices during power sequencing becomes challenging.

Embodiments of the present disclosure are directed to a circuit design and system that implement techniques for improving the exchange of signals between core devices operating in a first voltage domain (e.g., VDD) to devices operating in a second voltage domain (VDDQ). The disclosed circuit and system architecture provides a level shifter that is implemented using only thin-oxide devices and can still handle the generation of signals at the second voltage domain. The disclosed level shifter can also include various components to ensure that during power supply sequences (e.g., when the VDD or VDDQ power supply is switched ON/OFF or transitions are in a power state), the level shifter continues to provide reliable signals that are error and transient free. Particularly, the disclosed techniques provide a power sequence constraint free level shifter to level shift the voltage from VDD domain to VDDQ domain by using only thin-oxide devices.

In some cases, an always ON reference voltage generator circuit (which is not impacted or affected by transitions in the power supply voltage) is provided to generate the reference voltage derived from VDDQ supply to protect the thin-oxide devices from voltage stress. A supply voltage VDD ON/OFF detector is used to generate an output in the VDDQ domain using only thin-oxide devices. In this way, the output of the disclosed level shifter is well defined when the core voltage supply VDD is absent or turned OFF and the IO supply voltage VDDQ is still present. In this way, embodiments of the present disclosure protect the core devices from voltage stress during normal application, as well as during power sequencing which improves the overall functioning of the device.

In some examples, the disclosed techniques provide a system including a thin-oxide device voltage level shifter configured to convert an input signal associated with a first voltage domain to a plurality of output signals associated with the first voltage domain and a second voltage domain. The thin-oxide device voltage level shifter includes an input component that receives a first bias voltage and a second bias voltage each generated based on the second voltage domain The first bias voltage value representing a high-level voltage signal of the first voltage domain and the second bias voltage representing a low-level voltage signal of the second voltage domain and value correspond to a difference between the second voltage domain and the first voltage domain. The disclosed level shifter includes a first set of thin-oxide devices configured to generate a first output signal that corresponds to a logic level of the input signal. The first set of thin-oxide devices generate the first output signal at the high-level voltage signal when the input signal includes a high logic level, and the first set of thin-oxide devices generate the first output signal at a ground level voltage signal when the input signal includes a low logic level. The disclosed level shifter includes a second set of thin-oxide devices configured to generate a second output signal that corresponds to the logic level of the input signal. The second set of thin-oxide devices generate the second output signal at a power supply voltage level of the second voltage domain when the input signal includes the high logic level, and the second set of thin-oxide devices generate the second output signal at the second bias voltage when the input signal includes the low logic level.

In some examples, the first voltage domain corresponds to a first operating level of thin-oxide devices and the second voltage domain corresponds to a second operating level of thick-oxide devices. In some examples, the input signal is generated by one or more thin-oxide device components that operate in the first voltage domain. In some examples, the thin-oxide device voltage level shifter receives a first power supply voltage signal corresponding to the first voltage domain and a second power supply voltage signal corresponding to the second voltage domain.

In some examples, the thin-oxide device voltage level shifter is coupled to a reference voltage generator and a power supply transition detector. In some examples, the power supply transition detector includes a third set of thin-oxide devices to generate one or more signals indicating a power state of a power supply associated with the first voltage domain. In some examples, the reference voltage generator generates the first bias voltage and the second bias voltage independently of the power state of the power supply associated with the first voltage domain. In some examples, the thin-oxide device voltage level shifter includes a fourth set of thin-oxide devices configured to set the second output signal to the second bias voltage in response to receiving the one or more signals indicating that the power state of the power supply associated with the first voltage domain is OFF. In some examples, the thin-oxide device voltage level shifter includes a fourth set of thin-oxide devices configured to set the first output signal to the ground level voltage signal in response to receiving the one or more signals indicating that the power state of the power supply associated with the first voltage domain is OFF.

In some examples, the power supply transition detector includes a Schmitt trigger circuit to add hysteresis in a switching threshold of the one or more signals during transition of the power state of the power supply. In some examples, the reference voltage generator includes a voltage divider circuit coupled to a power supply of the second voltage domain with the first bias voltage being output by a first portion of the voltage divider circuit and the second bias voltage being output by a second portion of the voltage divider circuit.

In some examples, the thin-oxide device voltage level shifter includes only thin-oxide devices. In some examples, the first set of thin-oxide devices include a first plurality of thin-oxide PMOS and NMOS transistors and the second set of thin-oxide devices include a second plurality of thin-oxide PMOS and NMOS transistors.

In some examples, the thin-oxide device voltage level shifter includes a buffer circuit configured to generate an inverted buffered version of the input signal and a buffered version of the input signal. The thin-oxide device voltage level shifter includes a first thin-oxide device of the first set of thin-oxide devices configured to receive the buffered version of the input signal and generate the first output signal at the ground level voltage signal when the input signal includes the low logic level. The thin-oxide device voltage level shifter includes a second thin-oxide device of the first set of thin-oxide devices configured to receive the inverted buffered version of the input signal and generate the first output signal at the high-level voltage signal of the first voltage domain when the input signal includes the low logic level.

In some examples, the thin-oxide device voltage level shifter includes a third thin-oxide device of the second set of thin-oxide devices configured to receive the ground level voltage signal from the first thin-oxide device when the input signal includes the low logic level and generate the second output signal at the second bias voltage of the second voltage domain when the input signal includes the low logic level. The thin-oxide device voltage level shifter includes a fourth thin-oxide device of the second set of thin-oxide devices configured to receive the high-level voltage signal of the first voltage domain from the second thin-oxide device and generate the second output signal at the power supply voltage level of the second voltage domain when the input signal includes the low logic level.

In some examples, the techniques described herein relate to a method including converting an input signal associated with a first voltage domain to a plurality of output signals associated with the first voltage domain and a second voltage domain using a plurality of thin-oxide devices. The method includes receiving a first bias voltage and a second bias voltage each generated based on the second voltage domain. The first bias voltage value represents a high-level voltage signal of the first voltage domain and the second bias voltage represents a low-level voltage signal of the second voltage domain and value corresponding to a difference between the second voltage domain and the first voltage domain. The method includes generating, using a first set of thin-oxide devices, a first output signal that corresponds to a logic level of the input signal; the first set of thin-oxide devices generate the first output signal at the high level voltage signal when the input signal includes a high logic level, and the first set of thin-oxide devices generate the first output signal at a ground level voltage signal when the input signal includes a low logic level. The method includes generating, using a second set of thin-oxide devices, a second output signal that corresponds to the logic level of the input signal; the second set of thin-oxide devices generate the second output signal at a power supply voltage level of the second voltage domain when the input signal includes the high logic level, and the second set of thin-oxide devices generate the second output signal at the second bias voltage when the input signal includes the low logic level.

In some examples, the disclosed techniques generate first and second bias voltage signals based on a power supply voltage of a second voltage domain independent of any power state transitions of a first voltage domain. The first bias voltage signal value represents a power supply voltage of a first voltage domain and the second bias voltage signal value represents a difference between the power supply voltage of the second voltage domain and the power supply voltage of the first voltage domain. The first and second bias voltage signals are being used to prevent thin-oxide devices of a level shifter from operating in the second voltage domain. The disclosed techniques convert an input signal from the first voltage domain to the second voltage domain without operating any of the thin-oxide devices of the level shifter in the second voltage domain. The second voltage domain corresponds to a higher voltage than the first voltage domain.

Reference will now be made in detail to specific example embodiments for carrying out the disclosed subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

FIG. 1 illustrates an example circuit design 100 having a mix of thin-oxide and thick-oxide devices, in accordance with some embodiments. Specifically, the circuit design 100 includes a processor 110, an interface device 120, and an external device 130. In some cases, the processor 110 may be implemented in whole or in part using one or more thin-oxide devices. The thin-oxide devices may be implemented using 0.18 micrometer technology and have a thickness of approximately 3 nanometers. The thin-oxide devices of the processor 110 may operate using a first power supply voltage corresponding to a first voltage domain, such as 0.75 volts (V) or 1.8V. Such thin-oxide devices may fail to operate properly when a gate of a transistor of such devices receives a voltage greater than the first power supply voltage of the first voltage domain, referred to herein as VDD 112.

In some examples, the processor 110 may need to communicate with other components external to the processor 110, such as the external device 130. For example, the external device 130 may include a memory, such as dynamic random access memory (DRAM) which is implemented using thick-oxide devices. The thick-oxide devices may be implemented using different process technology than the process technology used to implement the thin-oxide devices and may have a thickness of approximately 7 nanometers. The thick-oxide devices may operate using a second power supply voltage corresponding to a second voltage domain, such as 3.3V. Such thick-oxide devices may fail to operate properly or react to signals when a gate of a transistor of such devices receives a voltage lower than the second power supply voltage of the second voltage domain, referred to herein as VDDQ 122.

The logic signals generated by the processor 110 may be in the first voltage domain and cannot be directly sent to the external device 130. Namely, providing signals to the external device 130 in the first voltage domain may cause the external device 130 to fail to respond or operate properly when receiving such signals. In such cases, the interface device 120 may be used to buffer and level shift the logic signals received from the processor 110 into the corresponding voltage domain of the external device 130 and vice versa. The interface device 120 may include circuitry that converts input signals from the first voltage domain to output signals in the first voltage domain and the second voltage domain. In this way, the processor 110 can communicate with the external device 130 via the interface device 120 and the external device 130 can communicate with the processor 110 via the interface device 120. Sometimes, to save power resources, the VDD 112 of the processor 110 may be turned OFF at least temporarily. The process of turning OFF the VDD 112 may introduce latencies and transients by the interface device 120 and the signals sent to and received from the external device 130. In order to ensure that such latencies and transients are avoided, the interface device 120 can implement a power supply ON/OFF detector to prevent the generation of such latencies and transients, as discussed below.

In some implementations, the interface device 120 is implemented using only thin-oxide devices. The interface device 120 can generate first and second bias voltage signals based on the VDDQ 122 independent of any power state transitions of a first voltage domain power supply voltage VDD 112. The first bias voltage signal value can represent a power supply voltage VDD 112 of the first voltage domain and the second bias voltage signal value can represent a difference between the power supply voltage VDDQ 122 of the second voltage domain and the power supply voltage VDD 112 of the first voltage domain. The first and second bias voltage signals are being used to prevent thin-oxide devices of a level shifter in the interface device 120 from operating in the second voltage domain. The interface device 120 converts an input signal received from the processor 110 (or other component operating in the first voltage domain) from the first voltage domain to the second voltage domain without operating any of the thin-oxide devices of the level shifter in the second voltage domain.

Figure 2:
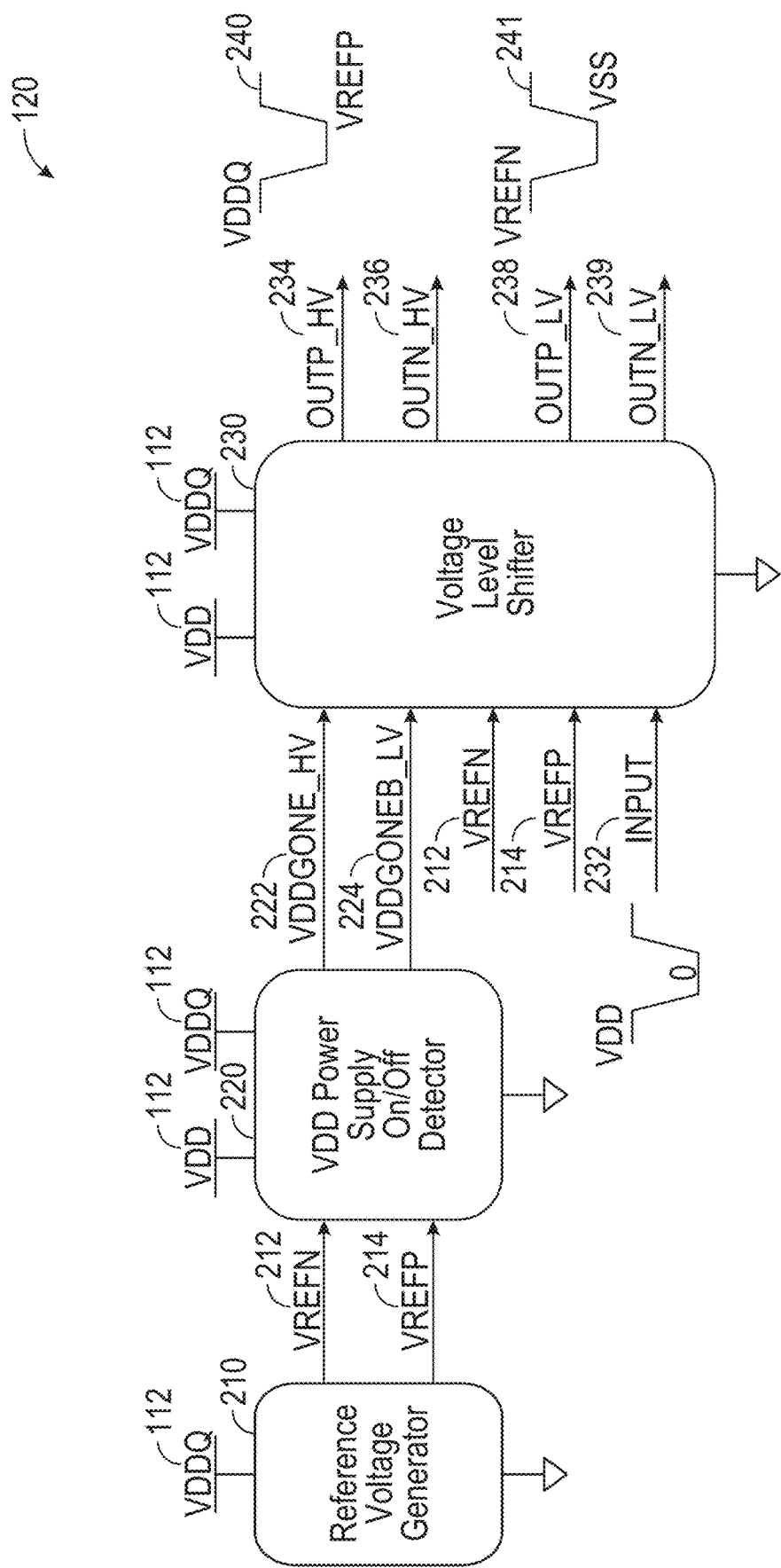
FIG. 2 is a diagram illustrating an example of a level shifting system, in accordance with some embodiments.

FIG. 2 is a diagram illustrating an example of a level shifting system for implementing at least a portion of the interface device 120, in accordance with some embodiments. In some examples, the interface device 120 includes a reference voltage generator 210, a power supply ON/OFF detector 220, and a voltage level shifter 230. Some or all of the components shown in FIG. 2 may be implemented by thin-oxide devices. In some cases, the voltage level shifter 230 may exclusively be implemented using thin-oxide devices.

In some examples, the reference voltage generator 210 receives the VDDQ 122 of the second voltage domain and generates a first voltage bias signal 212 (VREFN) and a second voltage bias signal 214 (VREFP). The first voltage bias signal 212 value can represent a power supply voltage VDD 112 of the first voltage domain and the second voltage bias signal 214 value can represent a difference between the power supply voltage VDDQ 122 of the second voltage domain and the power supply voltage VDD 112 of the first voltage domain. The first voltage bias signal 212 and the second voltage bias signal 214 can be provided to the power supply ON/OFF detector 220 along with VDD 112 and VDDQ 122. The first voltage bias signal 212 and the second voltage bias signal 214 can also be provided to the voltage level shifter 230 along with the VDD 112 and the VDDQ 122.

Figure 5:
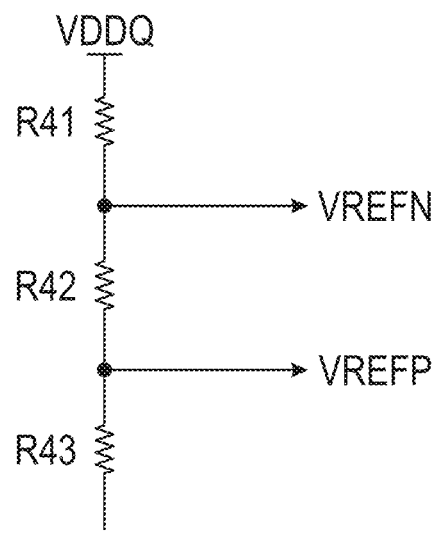
FIG. 5 illustrates an example reference voltage generator, in accordance with some embodiments.

FIG. 5 illustrates an example reference voltage generator 210, in accordance with some embodiments. The reference voltage generator 210 generates the reference voltage signal VREFP to protect the core PMOS devices (e.g., the thin-oxide devices of the processor 110 and/or the interface device 120) from voltage stress and generates the voltage reference signal VREFN to protect the core NMOS devices (e.g., the thin-oxide devices of the processor 110 and/or the interface device 120) from voltage stress.

As shown in FIG. 5, the reference voltage generator 210 includes a voltage divider circuit that includes a plurality of resistors R41, R42, and R43 coupled in series to the VDDQ 122. The resistor values can be selected such that the first voltage bias signal 212 provided by a node between resistor R41 and resistor R42 corresponds to the value of the power supply voltage of VDD 112. The resistor values can be selected such that the second voltage bias signal 214 provided by a node between resistor R42 and resistor R43 corresponds to a difference between the power supply voltage VDDQ 122 and the value of the power supply voltage of VDD 112. In an example, the first voltage bias signal 212 and the values of the resistors can be computed in accordance with VDD=VDDQ*(R42+R43)/(R41+R42+R43). In an example, the second voltage bias signal 214 and the values of the resistors can be computed in accordance with VDDQ-VDD=VDDQ*(R43)/(R41+R42+R43). The second voltage bias signal 214 can be of a lower value than the first voltage bias signal 212. Since the reference voltage generator 210 generates the first voltage bias signal 212 and the second voltage bias signal 214 based on the VDDQ 122, the reference voltage generator 210 is independent of changes in the state of the power supply voltage VDD 112. In this way, the reference voltage generator 210 is an always ON device which helps protect against transients and errors encountered by the voltage level shifter 230 during power sequencing of the VDD 112 (e.g., turning ON/OFF the VDD 112).

The reference voltage generator 210 ensures that during VDDQ power ramp-up, the voltage difference between VDDQ 122 and VREFP (the second voltage bias signal 214) remains within the voltage tolerance limit of the core devices (e.g., the thin-oxide devices, such as the processor 110). The resister R42 is used to create the offset between VREFN (first voltage bias signal 212) and VREFP (second voltage bias signal 214).

Referring back to FIG. 2, the power supply ON/OFF detector 220 is configured to detect a change in a power state of the power supply voltage VDD 112. The power supply ON/OFF detector 220 generates a VDDGONE_HV signal 222 and a VDDGONEB_LV signal 224 in response to and indicating the change in the power state of the power supply voltage VDD 112. The VDDGONE_HV signal 222 and the VDDGONEB_LV signal 224 are provided to the voltage level shifter 230 to ensure that signals generated by the voltage level shifter 230 continue to be output without transients and at suitable levels.

In some examples, the voltage level shifter 230 receives the input signal 232 in the first voltage domain and generates a plurality of output signals 234, 236, 238, and 239 in the first voltage domain and the second voltage domain representing the logic level of the input signal 232. A first output signal 234 of the plurality of output signals can represent the logic level of the input signal 232 in the second voltage domain. A second output signal 236 of the plurality of output signals can represent an inverted version of the logic level of the input signal 232 in the second voltage domain. A third output signal 238 of the plurality of output signals can represent the logic level of the input signal 232 in the first voltage domain. A fourth output signal 239 of the plurality of output signals can represent an inverted version of the logic level of the input signal 232 in the first voltage domain.

In some examples, the voltage level of the first output signal 234 can correspond to VDDQ 122 when the input signal 232 includes a high logic value and the voltage level of the first output signal 234 can correspond to the second voltage bias signal 214 (VREFP) when the input signal 232 includes a low logic value. Namely, a lowest voltage level of the first output signal 234 representing a logic 0 value is greater than 0V (VSS or ground) and corresponds to second voltage bias signal 214 whose value can be the difference between the power supply voltage of the second voltage domain and the power supply voltage of the first voltage domain. The voltage level of the third output signal 238 can correspond to first voltage bias signal 212 (VREFN) when the input signal 232 includes a high logic value and the voltage level of the third output signal 238 can correspond to ground or VSS when the input signal 232 includes a low logic value. Namely, a maximum voltage level of the third output signal 238 represents a logic 1 value never greater than the first voltage bias signal 212 (e.g., the maximum power supply voltage of the thin-oxide devices). In this way, the voltage level shifter 230 can generate the first and second output signals 234 and 236 to be provided to a thick-oxide device component, such as the external device 130. It can also generate the third and fourth output signals 238 and 239 to be provided to a thin-oxide device component, such as the processor 110 or another core device.

Figure 3:
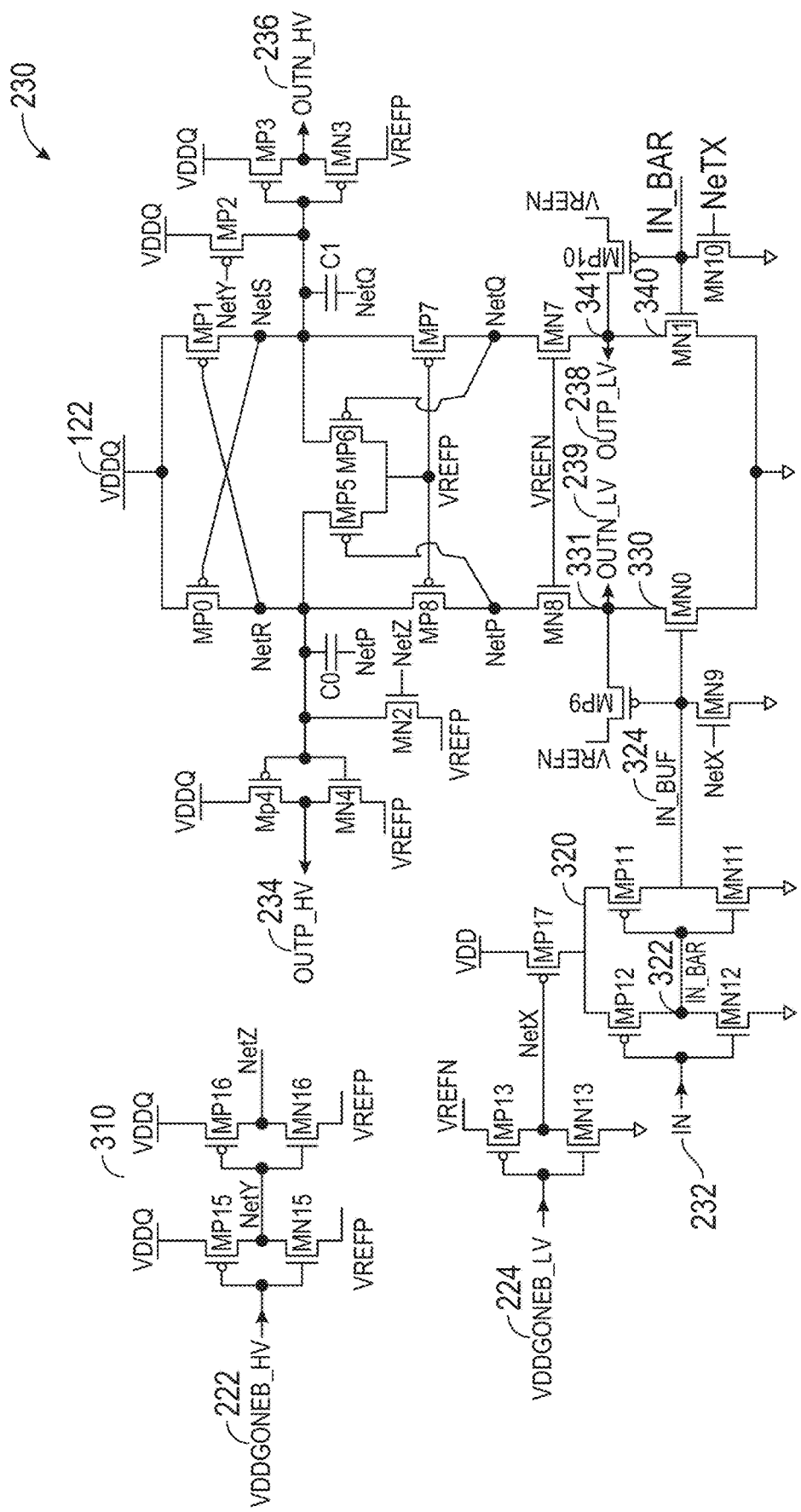
FIG. 3 is a diagram illustrating an example of a voltage level shifter implemented using thin-oxide devices (a thin-oxide device voltage level shifter), in accordance with some embodiments.

FIG. 3 is a diagram illustrating an example of schematic of a voltage level shifter 230 implemented using thin-oxide devices (a thin-oxide device voltage level shifter) in accordance with some embodiments. The voltage level shifter 230 includes a first set of thin-oxide devices 310 for generating NetY and NetZ signals as a function of the VDDGONE_HV signal 222. The voltage level shifter 230 includes a second set of thin-oxide devices 320 for buffering and inverting the input signal 232, such as generating an IN_BAR signal 322 which is a buffered inverted version of the input signal 232 and generating the IN_BUFF signal 324 which is the buffered version of the input signal 232. The voltage level shifter 230 includes additional thin-oxide devices for generating the plurality of output signals 234, 236, 238, and 239 using the first voltage bias signal 212 and the second voltage bias signal 214. The plurality of output signals 234, 236, 238, and 239 continue to be generated even when the VDD 112 is switched OFF or a power state of the VDD 112 changes.

Specifically, the core supply level input signal IN (e.g., the input signal 232) gets buffered by the inverters to generate the IN_BAR signal 322 which is inverted with respect to the input signal 232 and the IN_BUFF signal 324 which is buffered with respect to the input signal 232. A logic level '1' at the VDD 112 level corresponding to the first voltage domain at the input signal 232 causes the IN_BUFF signal 324 to be logic level 1 and the IN_BAR signal 322 to be a logic level 0. A logic level of 1 at the VDD 112 level corresponding to the first voltage domain at the input signal 232 causes the NMOS device MN0 330 to turn ON which forces logic low level at nodes OUTN_LV 239, NetP and NetR. In this way, when the input signal 232 is a logic level '1', the OUTN_LV 239 node provides the inverted version of the input signal 232 as the fourth output signal 239.

The logic low level of the node NetR will be at VREFP level (e.g., the second voltage bias signal 214) to ensure that the thin-oxide PMOS device MP1 will not be exposed to voltage stress. The logic low level at node NetP and OUTN_LV 239 will be 0V level when the logic level of 1 at the VDD 112 level corresponding to the first voltage domain at the input signal 232 is received. Continuing with this example, where the input signal 232 is at a logic level of 1, the logic low at node NetR turns ON the PMOS device MP1 and hence node NetS will be forced to logic high which corresponds to the VDDQ level (e.g., the power supply voltage VDDQ 122 of the second voltage domain). The logic high at node NetS will force node NetQ and node OUTP_LV 238 to logic high level. In this way, when the input signal 232 is a logic level '1', the node OUTP_LV 238 provides the voltage value of the input signal 232 in the first voltage domain as the third output signal 238. Specifically, a logic high level for node NetQ is at the VDDQ 122 voltage level whereas the logic high node OUTP_LV 238 is limited to VREFN (e.g., first voltage bias signal 212) level to ensure that the thin-oxide devices will be exposed to the voltage stress. The NMOS devices MN8 and MN7 limit the logic high voltage at nodes OUTN_LV 239 and OUTP_LV 238 to value of the first voltage bias signal 212 (e.g., the VREFN level). PMOS devices MP8 and MP7 limit the logic low voltage level at nodes NetR and NetS to VREFP level (e.g., the second voltage bias signal 214).

A logic low at node NetR causes a logic high VDDQ level at output node OUTP_HV (for providing the first output signal 234) when the input signal 232 is a logic level '1'. In this way, when the input signal 232 is a logic level '1' in the first voltage domain, the output node OUTP_HV (for providing the first output signal 234) provides the non-inverted version of the input signal 232 as the first output signal 234 in the second voltage domain. A logic high at node NetS forces a logic low VREFP level at output node OUTN_HV (for providing the second output signal 236). In this way, when the input signal 232 is a logic level '1' in the first voltage domain, the OUTN_HV node provides the inverted version of the input signal 232 as the second output signal 236 in the second voltage domain at VREFP level. Similarly, when the input signal 232 switches from logic high VDD level to logic low 0 level, the stages in the signal path toggle to generate a logic low VREFP level at output node OUTP_HV and logic high VDDQ level at output node OUTN_HV.

The Capacitor C0 and C1 are used to accelerate the transition at node NetR and NetS. This also helps in reducing the voltage difference between NetR and NetP and NetS and NetQ during the transition and ensures that devices MP8 and MP7 are not exposed to voltage stress during signal transition. When the core supply VDD is absent (such as when the VDD 112 is turned OFF or switches power states) the VDDGONEB_LV signal 224 will become logic low 0V level and VDDGONE_HV signal 222 will become logic high VDDQ level. The logic low at VDDGONEB_LV signal 224 will pass the VREFN voltage (first voltage bias signal 212) at the node NetX and hence the device MP17 will be turned OFF, and the nodes IN_BAR signal 322 and IN_BUFF signal 324 will be forced to logic 0 by devices MN9 and MN10. Logic high at VDDGONE_HV signal 222 will turn ON the devices MN2 and MP2 which will force logic low at node NetR and logic high at node NetS and hence cause the output of the level shifter 230 to be in the defined state when core supply VDD 112 is absent or turned OFF. The thin-oxide devices MN8 and MN7 are used to limit the voltage at node OUTN_LV 239 and node OUTP_LV 238 to VREFN level so that the thin-oxide devices will not exposed to voltage stress.

Figure 4:
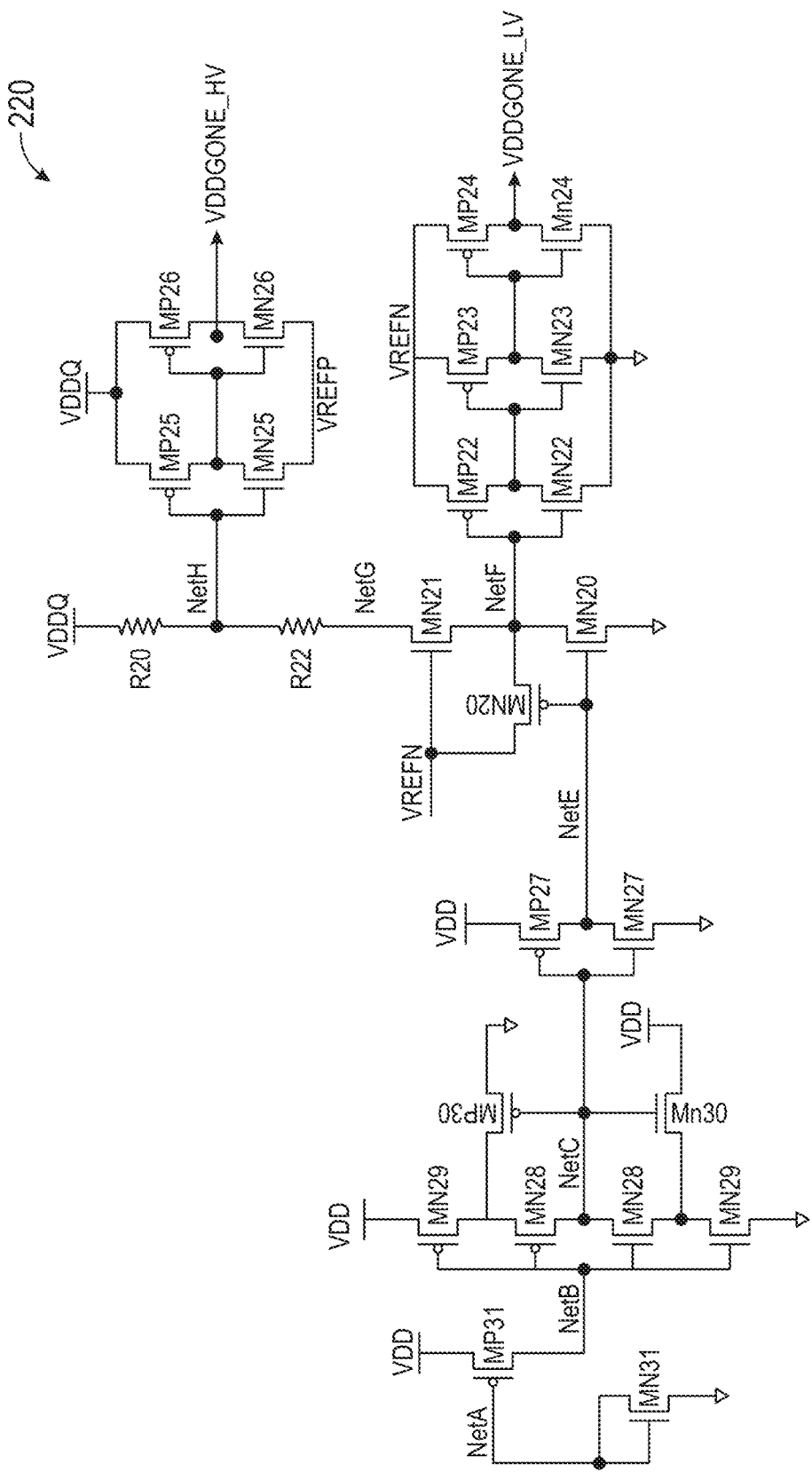
FIG. 4 is a diagram of an example power supply ON/OFF detector, in accordance with some embodiments.

FIG. 4 is a diagram of an example power supply ON/OFF detector 220, in accordance with some embodiments. The power supply ON/OFF detector 220 is used to generate a control signal VDDGONE_HV signal 222 in VDDQ domain (e.g., the second voltage domain) and VDDGONEB_LV signal 224 in VREFN domain (e.g., the first voltage domain), which is used to define the state of the level shifter output when the VDD 112 supply is absent or turned OFF. The power supply ON/OFF detector 220 uses a Schmitt trigger circuit to add hysteresis in the switching threshold of VDDGONE_HV signal 222 during VDD 112 ramp-up and VDD 112 ramp-down. This prevents the false triggering or transients of VDDGONE_HV signal 222 due to noise on VDD 112 supply.

Figure 6:
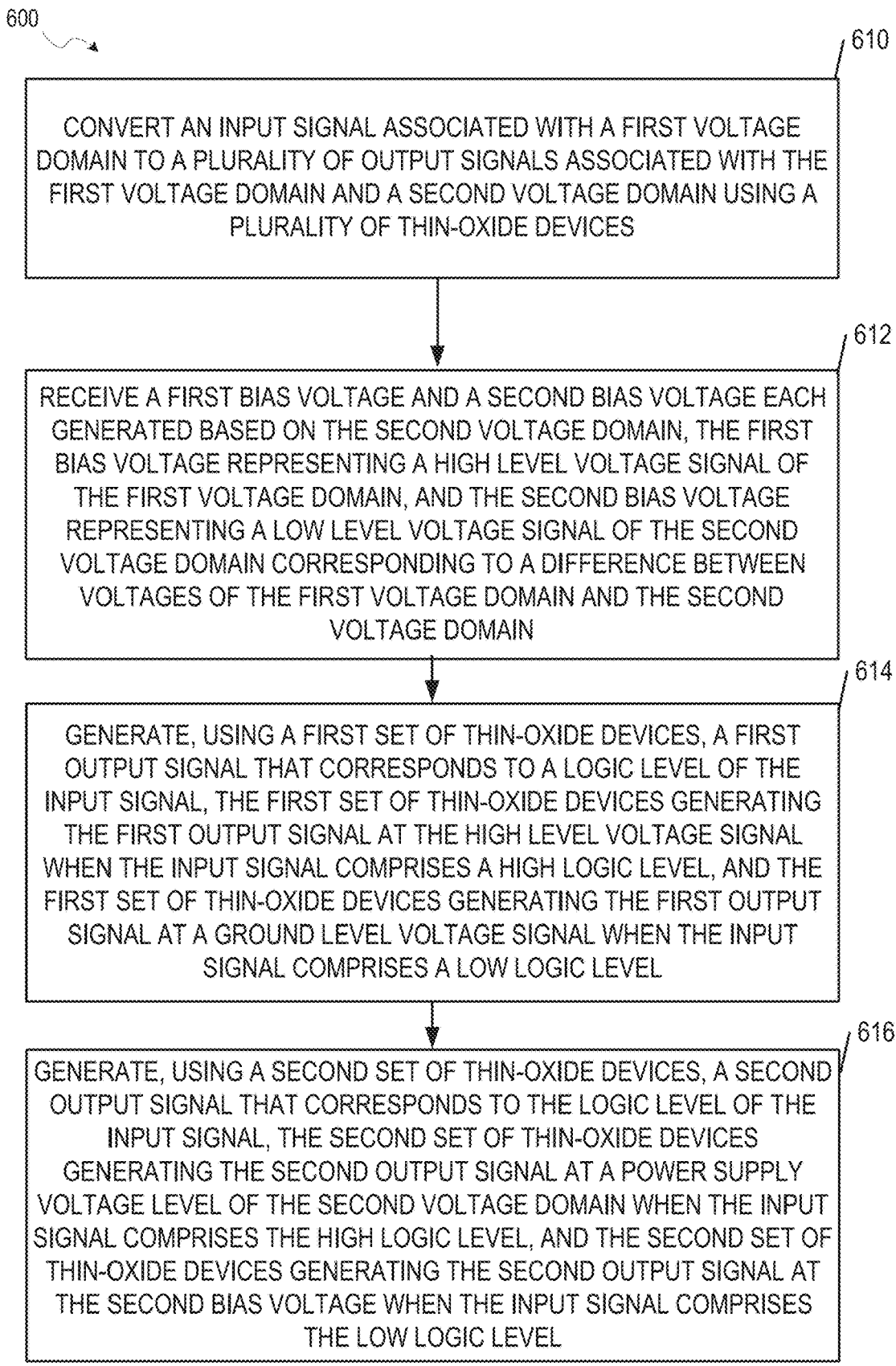
FIGS. 6 and 7 illustrate example methods for performing voltage level shifting of signals exchanged between thin-oxide operating in low-voltage domain to thick-oxide devices operating in high-voltage domain, in accordance with some embodiments.

FIG. 6 illustrates a method 600 for performing voltage level shifting pf signals exchanged between thin-oxide and thick-oxide devices, according to some embodiments of the present disclosure. The method 600 begins with operation 610 where an input signal associated with a first voltage domain is converted to a plurality of output signals associated with the first voltage domain and a second voltage domain using a plurality of thin-oxide devices. Then, at operation 612, a first bias voltage and a second bias voltage are received, each generated based on the second voltage domain, the first bias voltage value representing a high-level voltage signal of the first voltage domain, and the second bias voltage representing a low-level voltage signal of the second voltage domain and value corresponding to a difference between the second voltage domain and the first voltage domain. At operation 614, using a first set of thin-oxide devices, a first output signal is generated that corresponds to a logic level of the input signal, the first set of thin-oxide devices generate the first output signal at the high level voltage signal when the input signal comprises a high logic level, and the first set of thin-oxide devices generate the first output signal at a ground level voltage signal when the input signal comprises a low logic level. At operation 616, using a second set of thin-oxide devices, a second output signal is generated that corresponds to the logic level of the input signal, the second set of thin-oxide devices generate the second output signal at a power supply voltage level of the second voltage domain when the input signal comprises the high logic level, and the second set of thin-oxide devices generate the second output signal at the second bias voltage when the input signal comprises the low logic level.

Figure 7:
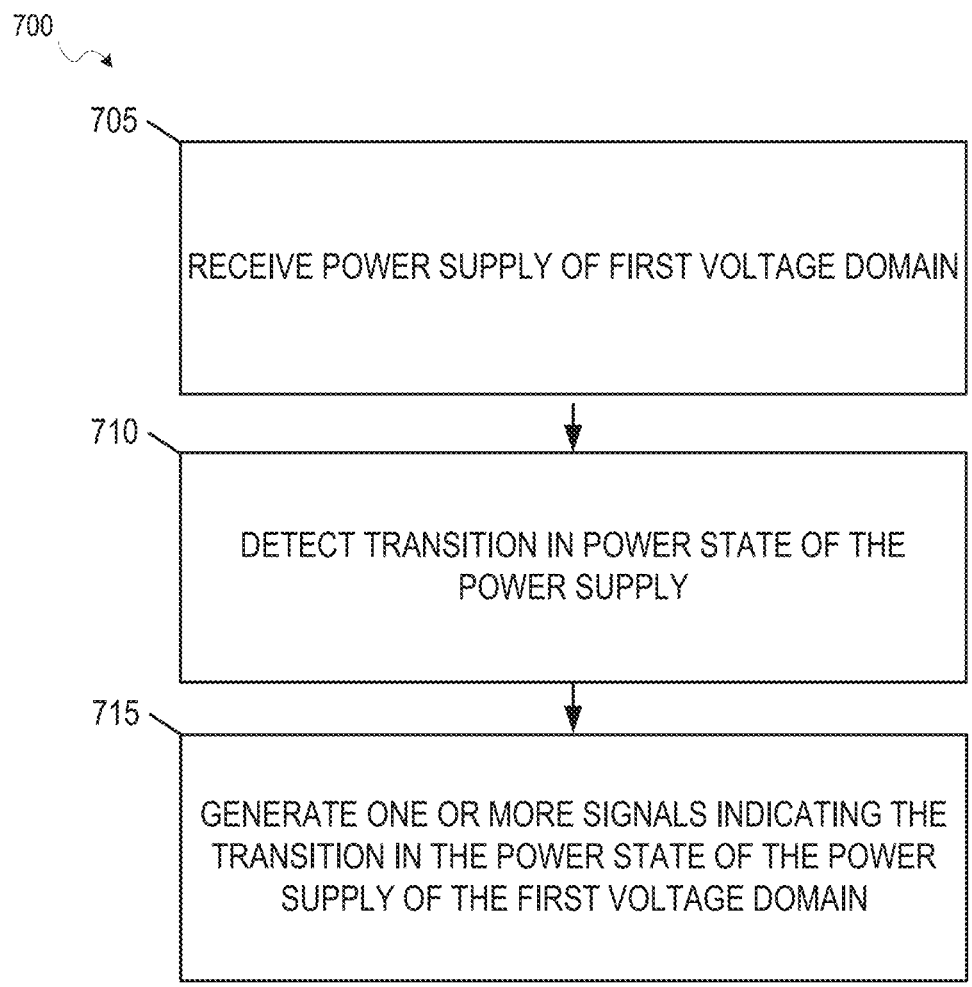

FIG. 7 illustrates a method 700 for performing voltage level shifting of signals exchanged between thin-oxide and thick-oxide devices, according to some embodiments of the present disclosure. The method 700 begins with operation 705 where a power supply of a first voltage domain is received. Then, at operation 710, a transition in the power state of the power supply is detected. At operation 715, one or more signals indicating the transition in the power state of the power supply of the first voltage domain are generated.

Figure 8:
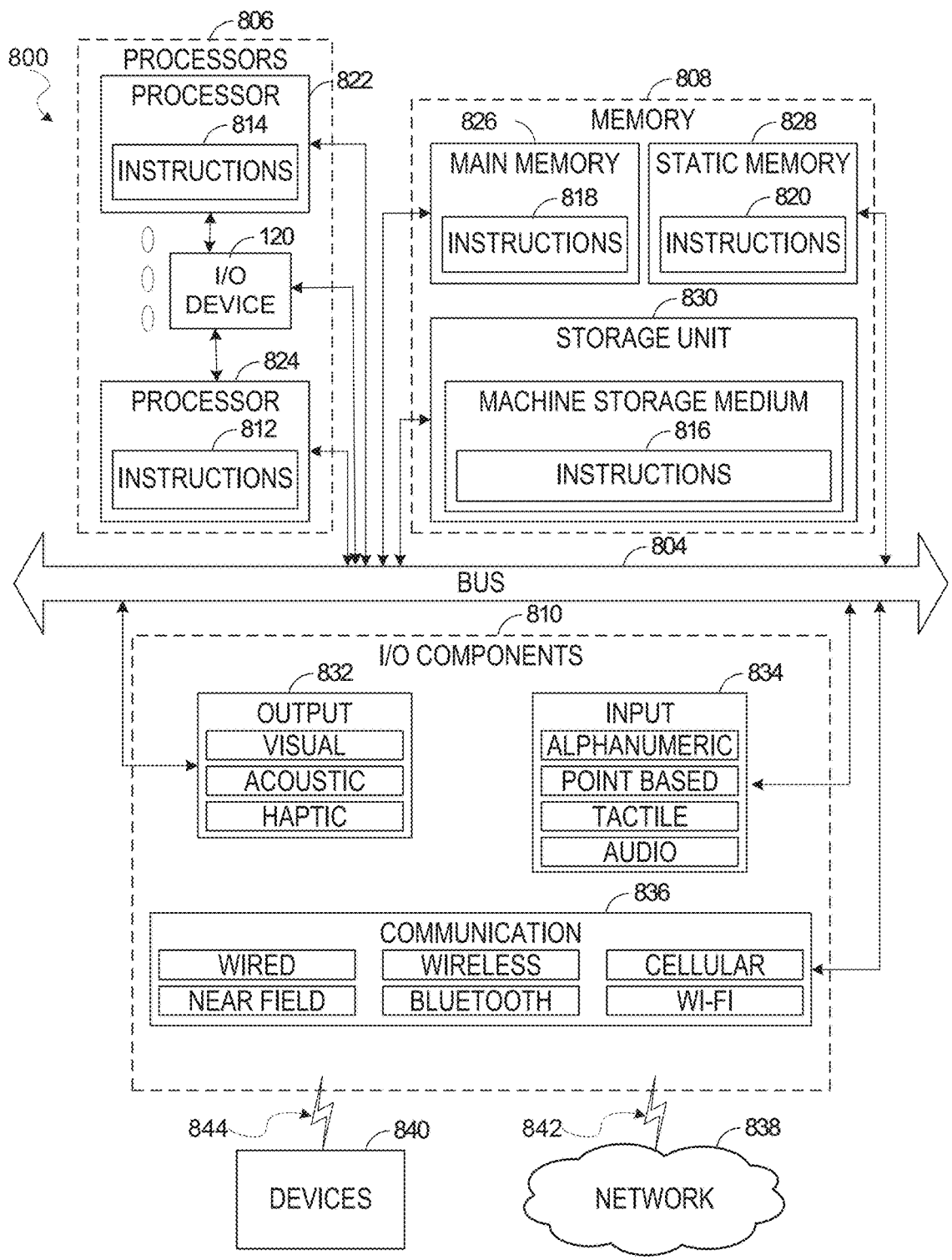
FIG. 8 is a functional block diagram of an example computing system for carrying out methods and operations described herein, in accordance with some embodiments of the present disclosure.

FIG. 8 is a functional block diagram of a computing system 800 for executing method 600 and other processes described above, along with other embodiments of the present disclosure. The computing system 800 may execute an EDA software system and for performing the methods 600 or 700, and other processes described above, in accordance with some embodiments of the present disclosure. A machine 802 is shown in the form of a computer system within which a set of instructions may be executed for causing the machine to perform any one or more of the methods 600 or 700 and other methodologies discussed herein, according to some embodiments. Specifically, FIG. 8 shows a diagrammatic representation of the machine 802 in the example form of a computer system. The machine 802 may include a bus 804, processors 806, memory 808, and I/O components 810, which may be configured to communicate with each other such as via the bus.

The machine 802 may include instructions 812-820 (e.g., software, a program, an application, an applet, an app, or other executable code) for causing the machine 802 to perform any one or more of the methodologies discussed herein. For example, the instructions 812-820 may cause the machine 802 to execute an EDA software system that executes the above processes described in the above description. The instructions 812-820 transform the general, non-programmed machine 802 into a particular machine 802 programmed to carry out the described and illustrated functions in the manner described here. In alternative embodiments, the machine 802 operates as a standalone device or may be coupled (e.g., networked) to other machines. In a networked deployment, the machine 802 may operate in the capacity of a server machine or a client machine in a server-client network environment, or as a peer machine in a peer-to-peer (or distributed) network environment. The machine 802 may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 812-820, sequentially or otherwise, that specify actions to be taken by the machine 802. Further, while only a single machine 802 is illustrated, the term "machine" shall also be taken to include a collection of machines 802 that individually or jointly execute the instructions 812-820 to perform any one or more of the methodologies discussed herein.

In an example embodiment, the processors 806 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 822 and a processor 824 that may execute the instructions 814 and 812. The term "processor" is intended to include multi-core processors 806 that may comprise two or more independent processors (sometimes referred to as "cores") that may execute instructions contemporaneously. Although FIG. 8 shows multiple processors 806, the machine 802 may include a single processor with a single core, a single processor with multiple cores (e.g., a multi-core processor), multiple processors with a single core, multiple processors with multiple cores, or any combination thereof.

The memory 808 may include a main memory 826, a static memory 828, and a storage unit 830, both accessible to the processors 806 such as via the bus 804. The main memory 826, the static memory 828, and the storage unit 830 store the instructions 816-820 embodying any one or more of the processes, methodologies or functions described herein. The instructions 812-820 may also reside, completely or partially, within the main memory 826, within the static memory 828, within the storage unit 820, within at least one of the processors 806 (e.g., within the processor's cache memory), or any suitable combination thereof, during execution thereof by the machine 802.

The I/O components 810 may include a wide variety of components to receive input, provide output, produce output, transmit information, exchange information, capture measurements, and so on. The specific I/O components 810 that are included in a particular machine will depend on the type of machine. For example, portable machines such as mobile phones will likely include a touch input device or other such input mechanisms, while a headless server machine will likely not include such a touch input device. It will be appreciated that the I/O components 810 may include many other components that are not shown in FIG. 8. The I/O components 810 are grouped according to functionality merely for simplifying the following discussion and the grouping is in no way limiting. In various example embodiments, the I/O components 810 may include output components 832 and input components 834. The output components 832 may include visual components (e.g., a display such as a plasma display panel (PDP), a light emitting diode (LED) display, a liquid crystal display (LCD), a projector, or a cathode ray tube (CRT)), acoustic components (e.g., speakers), other signal generators, and so forth. The input components 834 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 810 may include communication components 836 operable to couple the machine 802 to a network 838 or devices 840 via a coupling 842 and a coupling 844, respectively. For example, the communication components 836 may include a network interface component or another suitable device to interface with the network 838. In further examples, the communication components 836 may include wired communication components, wireless communication components, cellular communication components, and other communication components to provide communication via other modalities. The devices 840 may be another machine or any of a wide variety of peripheral devices (e.g., a peripheral device coupled via a universal serial bus (USB)).

Executable Instructions and Machine Storage Medium

The various memories (e.g., 808, 818, 820 and/or memory of the processor(s) 806, 822, 824) and/or the storage unit 830 may store one or more sets of instructions and data structures (e.g., software) embodied or utilized by any one or more of the methodologies or functions described herein. These instructions, when executed by the processor(s) 806, cause various operations to implement the disclosed embodiments.

As used herein, the terms "machine-storage medium," "device-storage medium," and "non-transitory computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate arrays (FPGAs), and flash memory devices; magnetic disks such as internal hard disks and removable disks; magneto-optical disks; and CD-ROM and DVD-ROM disks. The terms "machine-storage media, "computer-storage media," and "device-storage media" specifically exclude carrier waves, modulated data signals, and other such media, at least some of which are covered under the term "signal medium" discussed below.

Transmission Medium

In various example embodiments, one or more portions of the network 838 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 838 or a portion of the network 838 may include a wireless or cellular network, and the coupling 842 may be a Code Division Multiple Access (CDMA) connection, a Global System for Mobile communications (GSM) connection, or another type of cellular or wireless coupling. In this example, the coupling 842 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-Speed Packet Access (HSPA), Worldwide Interoperability for Microwave Access (WiMAX), Long Term Evolution (LTE) standard, others defined by various standard-setting organizations, other long-range protocols, or other data transfer technology.

The instructions 812-820 may be transmitted or received over the network 838 using a transmission medium via a network interface device (e.g., a network interface component included in the communication components 836) and utilizing any one of a number of well-known transfer protocols (e.g., hypertext transfer protocol (HTTP)). Similarly, the instructions 812-820 may be transmitted or received using a transmission medium via the coupling 844 (e.g., a peer-to-peer coupling) to the devices 840. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 812-820 for execution by the machine 802, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media (non-transitory computer readable media or medium) and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, method or process that includes elements in addition to those listed after such a term in a claim is still deemed to fall within the scope of that claim.

What is claimed is:

1. A system comprising:
 a thin-oxide device voltage level shifter configured to convert an input signal associated with a first voltage domain to a plurality of output signals associated with the first voltage domain and a second voltage domain, the thin-oxide device voltage level shifter comprising:
 an input component that receives a first bias voltage and a second bias voltage, each generated based on the second voltage domain, the first bias voltage corresponding to a high-level voltage signal of the first voltage domain, and the second bias voltage corresponding to a low-level voltage signal of the second voltage domain and a value corresponding to a difference between voltage levels of the second voltage domain and the first voltage domain;
 a first set of thin-oxide devices configured to generate a first output signal of the plurality of output signals that corresponds to a logic level of the input signal between the high-level voltage signal of the first voltage domain and a ground level voltage signal; and
 a second set of thin-oxide devices configured to generate a second output signal of the plurality of output signals that corresponds to the logic level of the input signal between a power supply voltage level of the second voltage domain and the second bias voltage representing the low-level voltage signal of the second voltage domain, the first set of thin-oxide devices generating the first output signal at the first bias voltage and the second set of thin-oxide devices generating the second output signal at the power supply voltage level of the second voltage domain when the input signal comprises a high logic level, wherein the first output signal is associated with a first voltage range comprising a first high value and a first low value, the first high value of the first voltage range corresponding to the high-level voltage signal and the first low value of the first voltage range corresponding to the ground level voltage signal, wherein the second output signal is associated with a second voltage range comprising a second high value and a second low value, the second high value corresponding to the power supply voltage level of the second voltage domain and the second low value corresponding to the second bias voltage, wherein the first output signal is generated at the first high value and the second output signal is generated at the second high value when the input signal comprises the high logic level.

2. The system of claim 1, wherein the first voltage domain corresponds to a first operating level of thin-oxide devices and the second voltage domain corresponds to a second operating level of thick-oxide devices.

3. The system of claim 1, wherein the input signal is generated by one or more thin-oxide device components that operate in the first voltage domain, and the first set of thin-oxide devices generating the first output signal at the ground level voltage signal when the input signal comprises a low logic level, and the second set of thin-oxide devices generating the second output signal at the second bias voltage when the input signal comprises the low logic level.

4. The system of claim 1, wherein the thin-oxide device voltage level shifter receives a first power supply voltage signal corresponding to the first voltage domain and a second power supply voltage signal corresponding to the second voltage domain.

5. The system of claim 1, wherein the thin-oxide device voltage level shifter is operatively coupled to a reference voltage generator and a power supply transition detector.

6. The system of claim 5, wherein the power supply transition detector comprises a third set of thin-oxide devices to generate one or more signals indicating a power state of a power supply associated with the first voltage domain.

7. The system of claim 6, wherein the reference voltage generator generates the first bias voltage and the second bias voltage independently of the power state of the power supply.

8. The system of claim 7, wherein the thin-oxide device voltage level shifter comprises a fourth set of thin-oxide devices configured to receive the one or more signals and to set the second output signal to the second bias voltage in response to the one or more signals indicating that the power state of the power supply is OFF.

9. The system of claim 7, wherein the thin-oxide device voltage level shifter comprises a fourth set of thin-oxide devices configured to receive the one or more signals and to set the first output signal to the ground level voltage signal in response to the one or more signals indicating that the power state of the power supply is OFF.

10. The system of claim 6, wherein the power supply transition detector comprises a Schmitt trigger circuit configured to add hysteresis in a switching threshold of the one or more signals during transition of the power state of the power supply.

11. The system of claim 5, wherein the reference voltage generator comprises a voltage divider circuit operatively coupled to a power supply of the second voltage domain, the first bias voltage being outputted by a first portion of the voltage divider circuit and the second bias voltage being outputted by a second portion of the voltage divider circuit.

12. The system of claim 1, wherein the first set of thin-oxide devices comprise a first plurality of thin-oxide PMOS and NMOS transistors, and wherein the second set of thin-oxide devices comprise a second plurality of thin-oxide PMOS and NMOS transistors.

13. The system of claim 1, wherein the thin-oxide device voltage level shifter comprises:
a buffer circuit configured to generate an inverted buffered version of the input signal and a buffered version of the input signal;
a first thin-oxide device of the first set of thin-oxide devices configured to receive the buffered version of the input signal and to generate the first output signal at the ground level voltage signal when the input signal comprises a low logic level; and
a second thin-oxide device of the first set of thin-oxide devices configured to receive the inverted buffered version of the input signal and to generate the first output signal at the high-level voltage signal of the first voltage domain when the input signal comprises the low logic level.

14. The system of claim 13, wherein the thin-oxide device voltage level shifter comprises:
a third thin-oxide device of the second set of thin-oxide devices configured to receive the ground level voltage signal from the first thin-oxide device when the input signal comprises the low logic level and to generate the second output signal at the second bias voltage of the second voltage domain when the input signal comprises the low logic level; and
a fourth thin-oxide device of the second set of thin-oxide devices configured to receive the high-level voltage signal of the first voltage domain from the second thin-oxide device and to generate the second output signal at the power supply voltage level of the second voltage domain when the input signal comprises the low logic level.

15. The system of claim 1, wherein the thin-oxide device voltage level shifter comprises an additional set of thin-oxide devices configured to set the second output signal to the second bias voltage in response to one or more signals indicating that a power state of a power supply is OFF.

16. The system of claim 1, wherein the input signal is generated by one or more thin-oxide device components that operate in the first voltage domain, wherein the thin-oxide device voltage level shifter comprises an additional set of thin-oxide devices configured to set the first output signal to the ground level voltage signal in response to one or more signals indicating that a power state of a power supply is OFF.

17. The system of claim 1, wherein the thin-oxide device voltage level shifter comprises an additional set of thin-oxide devices configured to set at least one of the first output signal or the second output signal to a lower voltage level in a respective voltage range in response to one or more signals indicating that a power state of a power supply is OFF.

18. A method comprising:
converting an input signal associated with a first voltage domain to a plurality of output signals associated with the first voltage domain and a second voltage domain using a plurality of thin-oxide devices, the converting comprising:
receiving a first bias voltage and a second bias voltage, each generated based on the second voltage domain, the first bias voltage corresponding to a high-level voltage signal of the first voltage domain, and the second bias voltage corresponding to a low-level voltage signal of the second voltage domain and a value corresponding to a difference between voltage levels of the second voltage domain and the first voltage domain;
generating, using a first set of thin-oxide devices, first output signal of the plurality of output signals that corresponds to a logic level of the input signal between the high-level voltage signal of the first voltage domain and a ground level voltage signal; and
generating, using a second set of thin-oxide devices, a second output signal of the plurality of output signals that corresponds to the logic level of the input signal between a power supply voltage level of the second voltage domain and the second bias voltage representing the low-level voltage signal of the second voltage domain, the first set of thin-oxide devices generating the first output signal at the first bias voltage and the second set of thin-oxide devices generating the second output signal at the power supply voltage level of the second voltage domain when the input signal comprises a high logic level, wherein the first output signal is associated with a first voltage range comprising a first high value and a first low value, the first high value of the first voltage range corresponding to the high-level voltage signal and the first low value of the first voltage range corresponding to the ground level voltage signal, wherein the second output signal is associated with a second voltage range comprising a second high value and a second low value, the second high value corresponding to the power supply voltage level of the second voltage domain and the second low value corresponding to the second bias voltage, wherein the first output signal is generated at the first high value and the second output signal is generated at the second high value when the input signal comprises the high logic level.

19. An apparatus comprising:
means for converting an input signal associated with a first voltage domain to a plurality of output signals associated with the first voltage domain and a second voltage domain using a plurality of thin-oxide devices, the means for converting comprising:
means for receiving a first bias voltage and a second bias voltage, each generated based on the second voltage domain, the first bias voltage corresponding to a high-level voltage signal of the first voltage domain, and the second bias voltage corresponding to a low-level voltage signal of the second voltage domain and a value corresponding to a difference between voltage levels of the second voltage domain and the first voltage domain;
means for generating, using a first set of thin-oxide devices, first output signal of the plurality of output signals that corresponds to a logic level of the input signal between the high-level voltage signal of the first voltage domain and a ground level voltage signal; and
means for generating, using a second set of thin-oxide devices, a second output signal of the plurality of output signals that corresponds to the logic level of the input signal between a power supply voltage level of the second voltage domain and the second bias voltage representing the low-level voltage signal of the second voltage domain, the first set of thin-oxide devices generating the first output signal at the first bias voltage and the second set of thin-oxide devices generating the second output signal at the power supply voltage level of the second voltage domain when the input signal comprises a high logic level, wherein the first output signal is associated with a first voltage range comprising a first high value and a first low value, the first high value of the first voltage range corresponding to the high-level voltage signal and the first low value of the first voltage range corresponding to the ground level voltage signal, wherein the second output signal is associated with a second voltage range comprising a second high value and a second low value, the second high value corresponding to the power supply voltage level of the second voltage domain and the second low value corresponding to the second bias voltage, wherein the first output signal is generated at the first high value and the second output signal is generated at the second high value when the input signal comprises the high logic level.

* * * * *